United States Patent
Kim

(10) Patent No.: US 11,996,643 B2
(45) Date of Patent: May 28, 2024

(54) FPCB CONNECTOR, AND BATTERY MODULE AND BATTERY PACK INCLUDING THE SAME

(71) Applicant: LG Chem, Ltd., Seoul (KR)

(72) Inventor: Sung-Gyu Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 441 days.

(21) Appl. No.: 17/281,295

(22) PCT Filed: Jun. 18, 2020

(86) PCT No.: PCT/KR2020/007930
§ 371 (c)(1),
(2) Date: Mar. 30, 2021

(87) PCT Pub. No.: WO2021/033902
PCT Pub. Date: Feb. 25, 2021

(65) Prior Publication Data
US 2022/0006220 A1 Jan. 6, 2022

(30) Foreign Application Priority Data
Aug. 20, 2019 (KR) .......................... 10-2019-0101973

(51) Int. Cl.
*H01R 12/78* (2011.01)
*H01M 10/42* (2006.01)
(Continued)

(52) U.S. Cl.
CPC .......... *H01R 12/78* (2013.01); *H01M 10/425* (2013.01); *H01R 12/7064* (2013.01);
(Continued)

(58) Field of Classification Search
CPC .. H01R 13/506; H01R 12/778; H01R 12/777; H01R 12/73; H01R 12/78;
(Continued)

(56) References Cited

U.S. PATENT DOCUMENTS 3,065,446 A * 11/1962 Langzettel ............. H01R 12/61
439/495
3,082,398 A    3/1963 Valach
(Continued)

FOREIGN PATENT DOCUMENTS

CN     1537345 A      10/2004
CN     210015997 U    2/2020
(Continued)

OTHER PUBLICATIONS

Search Report dated Mar. 18, 2022 from Office Action for Chinese Application No. 202080005651.3 dated Mar. 23, 2022. 3 pgs.
(Continued)

*Primary Examiner* — Briggitte R. Hammond
(74) *Attorney, Agent, or Firm* — Lerner David LLP

(57) ABSTRACT

A FPCB connector including a first main body to which a first FPCB is coupled, and a second main body to which a second FPCB is coupled, the second main body being coupled to and electrically connected to the first main body. At least one of the first main body and the second main body is coupled to the first FPCB or the second FPCB without soldering.

12 Claims, 8 Drawing Sheets

(51) Int. Cl.
  *H01M 50/204* (2021.01)
  *H01R 12/70* (2011.01)
  *H01R 13/627* (2006.01)
  *H05K 1/14* (2006.01)

(52) U.S. Cl.
  CPC ......... *H01R 13/6272* (2013.01); *H05K 1/14* (2013.01); *H01M 50/204* (2021.01); *H05K 2201/10037* (2013.01)

(58) Field of Classification Search
  CPC ............ H01R 12/7064; H01R 13/6272; H01R 12/774; H01R 13/502; H01R 13/629; H01R 13/639; Y02E 60/10; H01M 10/425; H01M 50/204; H01M 50/20; H05K 1/14; H05K 2201/10037
  See application file for complete search history.

(56) References Cited

U.S. PATENT DOCUMENTS

| | | | |
|---|---|---|---|
| 3,141,720 | A | 7/1964 | Johnson |
| 3,188,601 | A | 6/1965 | De Tar |
| 3,366,919 | A * | 1/1968 | Gammel, Sr. .......... H01R 12/78 439/495 |
| 3,950,070 | A | 4/1976 | Groft et al. |
| 4,802,866 | A | 2/1989 | Balzano et al. |
| 6,364,682 | B1 | 4/2002 | Cappe |
| 6,468,089 | B1 | 10/2002 | Hubbard et al. |
| 2002/0072271 | A1 | 6/2002 | Fuerst et al. |
| 2002/0119696 | A1 | 8/2002 | Okamura et al. |
| 2006/0099849 | A1 | 5/2006 | Aeschbacher |
| 2011/0269321 | A1 | 11/2011 | Mizoguchi |
| 2013/0137285 | A1 | 5/2013 | Miura et al. |
| 2013/0149883 | A1 | 6/2013 | Lin et al. |

FOREIGN PATENT DOCUMENTS

| | | |
|---|---|---|
| DE | 1440842 A1 | 11/1968 |
| DE | 10239088 A1 | 3/2004 |
| EP | 1235303 A2 | 8/2002 |
| FR | 2782576 A1 | 2/2000 |
| FR | 2841394 A1 | 12/2003 |
| JP | 2006260803 A | 9/2006 |
| JP | 2009277534 A | 11/2009 |
| JP | 201243570 A | 3/2012 |
| JP | 2014175271 A | 9/2014 |
| KR | 20020046965 A | 6/2002 |
| KR | 20110005263 A | 1/2011 |
| KR | 20110066243 A | 6/2011 |
| KR | 101883377 B1 | 7/2018 |
| KR | 20190048478 A | 5/2019 |
| KR | 20190048538 A | 5/2019 |
| KR | 101987593 B1 | 6/2019 |
| NL | 7506013 A | 12/1975 |
| WO | 2004040708 A1 | 5/2004 |
| WO | 2007131537 A1 | 11/2007 |

OTHER PUBLICATIONS

International Search Report dated Nov. 3, 2020 for Application No. PCT/KR2020/007930, 3 pages.
European Extended Search Report for Application No. 20855291.9 dated Jan. 21, 2022. 11 pgs.

* cited by examiner

FPCB CONNECTOR, AND BATTERY MODULE AND BATTERY PACK INCLUDING THE SAME

CROSS-REFERENCE TO RELATED APPLICATIONS

The present application is a national phase entry under 35 U.S.C. § 371 of International Application No. PCT/KR2020/007930 filed Jun. 18, 2020, published in Korean, which claims priority from Korean Patent Application No. 10-2019-0101973 filed Aug. 20, 2019, all of which are incorporated herein by reference.

TECHNICAL FIELD

The present disclosure relates to a flexible printed circuit board (FPCB) connector, and a battery module and a battery pack including the FPCB connector, and more particular, to a FPCB connector where a FPCB may be coupled to a connector without soldering, and a battery module and a battery pack including the FPCB connector.

BACKGROUND ART

In general, a connector is used in various electronic devices for signal transmission and power supply with various additional devices. For example, a connector for connecting FPCBs is used for charging and discharging a secondary battery product, including electronic devices such as laptops, tablet PCs, and smart phones.

FIG. 1 is a schematic sectional view showing a conventional FPCB connector. Referring to FIG. 1, a FPCB 1 is coupled to a connector 2 by means of soldering 3. However, in the conventional art where the FPCB 1 is coupled to the connector 2 by soldering 3, the flatness of the FPCB 1 must be considered for the soldering 3, and a reinforcing plate is required, which results in complicated processes and high cost. In addition, productivity is deteriorated due to high soldering defect rate.

SUMMARY

Technical Problem

The present disclosure is directed to providing a FPCB connector where a FPCB may be coupled to a connector without soldering, and a battery module and a battery pack including the FPCB connector.

Technical Solution

In one aspect of the present disclosure, there is provided a FPCB connector, comprising: a first main body configured to be coupled to first FPCB; and a second main body configured to be coupled to second FPCB that is coupled and electrically connected to the first main body, wherein at least one of the first main body and the second main body is configured to be coupled to the first FPCB or the second FPCB without soldering.

Also, the first main body may include a first body having an insert groove configured to receive the first FPCB; and a first fixing portion coupled to the first body and configured to fix the first FPCB in place.

In addition, a stepped portion formed by a height difference may be formed at a bottom of the first body, and the stepped portion is adapted for the first FPCB may be located along a first surface of the stepped portion when inserted into the insert groove and either in contact with the first surface of the stepped portion or spaced apart from the first surface of the stepped portion.

Also, the stepped portion may include a high surface having a first height; and a low surface having a second height that is lower than the first height, the first FPCB may have a first body portion and a first end portion, the first end portion of the first FPCB may be thicker than the first body portion of the first FPCB, the high surface of the stepped portion may be configured to be in contact with or spaced apart from first end portion of the first FPCB, the low surface of the stepped portion may be configured to be spaced apart from the first body portion of the first FPCB by a predetermined distance, and the first fixing portion may be configured to be inserted into the space to be coupled to the first body and in contact with the first body portion of the first FPCB.

In addition, the second main body may include a coupling groove formed at an upper surface of the second main body, and the first main body may include a coupling protrusion coupled to the coupling groove and formed at an upper side of the first main body so that the first main body and the second main body are coupled to each other.

Also, the second main body may include a second body having an open portion formed at one side thereof and configured to receive the second FPCB; one or more terminal members coupled to the second body and configured to electrically connect the first FPCB and the second FPCB when the first main body is coupled to the second main body; and a second fixing portion coupled to the second body through the open portion of the second body and configured to receive the second FPCB to fix the second FPCB in place.

In addition, the second body may include one or more first extensions extending from a first side of the second main body; and one or more second extensions extending from a second side of the second main body and located opposite to the first extension, and the second body may be configured to receive the second FPCB between the first extension and the second extension.

Also, the one or more second extensions may be a plurality of second extensions arranged at preset intervals, and the one or more terminal members may be a plurality of terminal members, and each terminal member may be disposed between a respective pair of second extensions.

In addition, the second fixing portion may include a contact portion configured to contact the second FPCB, and at least one of the plurality of terminal members may be interposed between the contact portion and one of the plurality of second extensions.

Also, the second FPCB may have a second body portion and a second end portion and the second end portion of the second FPCB may be formed wider than the second body portion of the second FPCB, and the second fixing portion may include catching portions extending inward into the second body and configured to catch the second end portion of the second FPCB.

Meanwhile, in another aspect of the present disclosure, there is provided a battery module, comprising an FPCB connector of any of the embodiment described herein, and there is also provided a battery pack, comprising an FPCB connector of any of the embodiments described herein.

Advantageous Effects

According to the embodiments of the present disclosure, a FPCB may be coupled to a connector without soldering.

In addition, since the process is simplified, manufacturing is simplified, and the defect rate is reduced, thereby improving productivity.

DETAILED DESCRIPTION

Figure 1:
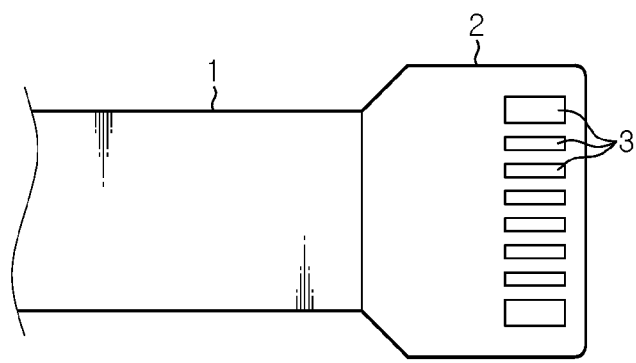
FIG. 1 is a schematic sectional view showing a conventional FPCB connector.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the drawings, the size of each element or a specific part of the element may be exaggerated, omitted, or schematically illustrated for convenience and clarity of a description. Thus, the size of each element does not entirely reflect the actual size of the element. A detailed description of well-known functions or elements associated with the present disclosure will be omitted if it unnecessarily obscures the subject matter of the present disclosure.

The term, 'combine' or 'connect' as used herein, may refer not only to a case where one member and another member are directly combined or directly connected but also a case where one member is indirectly combined with another member via a connecting member or is indirectly connected.

In this specification, a FPCB refers to a flexible printed circuit board, and soldering refers to lead soldering. In addition, in this specification, it should be noted that a fixing portion refers to a concept that includes all of a case where the fixing portion is in close contact with the FPCB without any space therebetween to completely block the movement of the FPCB and a case where the FPCB is caught by the fixing portion not to be separated from a main body even though there is a slight gap.

Figure 2:
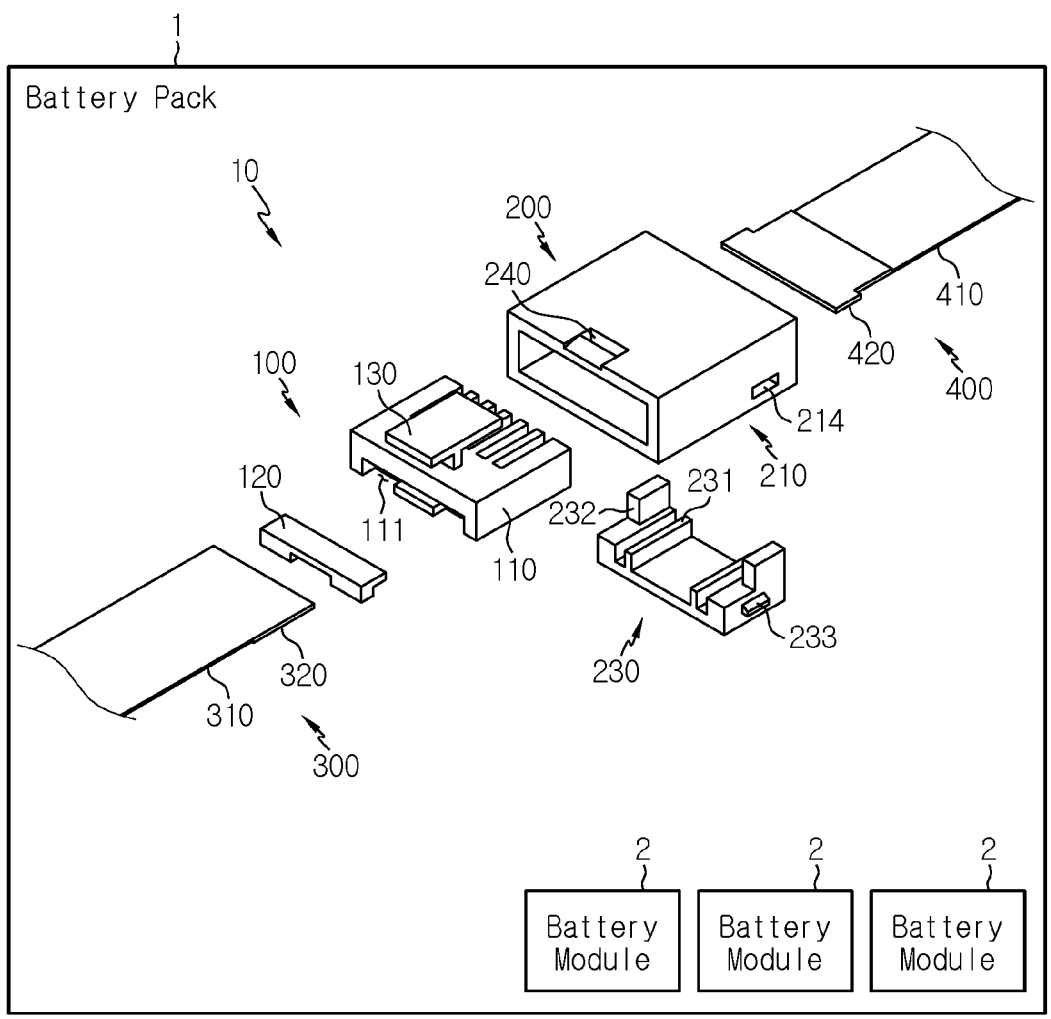
FIG. 2 is an exploded perspective view showing a FPCB connector according to the first embodiment of the present disclosure.
Figure 3:
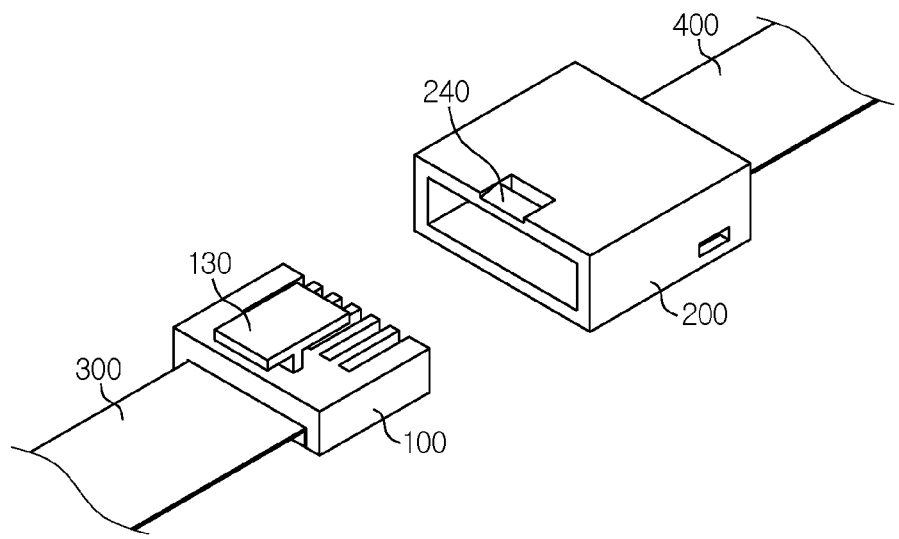
FIG. 3 is a perspective view showing that a FPCB is coupled to a main body of a connector, in the FPCB connector according to the first embodiment of the present disclosure.
Figure 4:
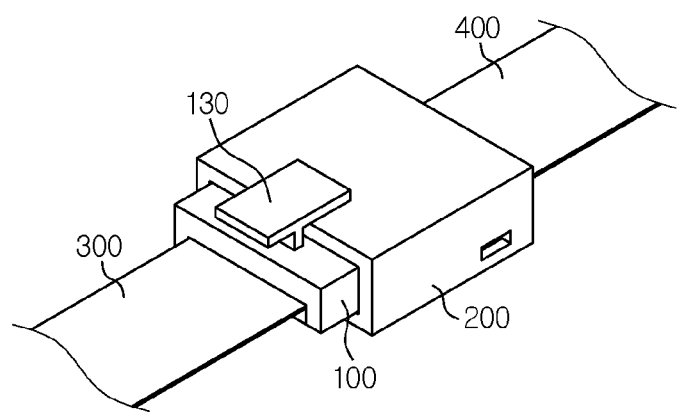
FIG. 4 is a perspective view showing that a first main body of the connector coupled to a first FPCB and a second main body of the connector coupled to a second FPCB are coupled to each other, in the FPCB connector according to the first embodiment of the present disclosure.
Figure 5:
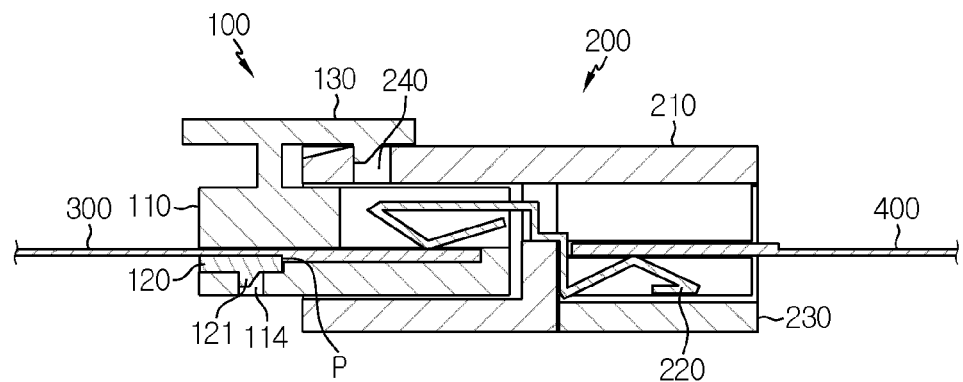
FIG. 5 is a sectional view of FIG. 4.
Figure 6:
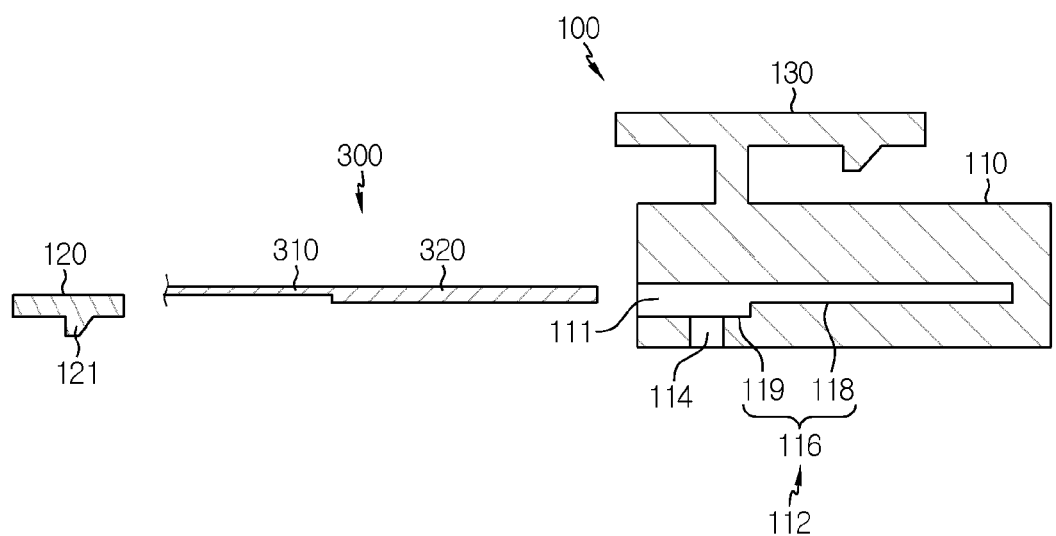
FIG. 6 is an exploded sectional view showing the first main body of the FPCB connector according to the first embodiment of the present disclosure.
Figure 7:
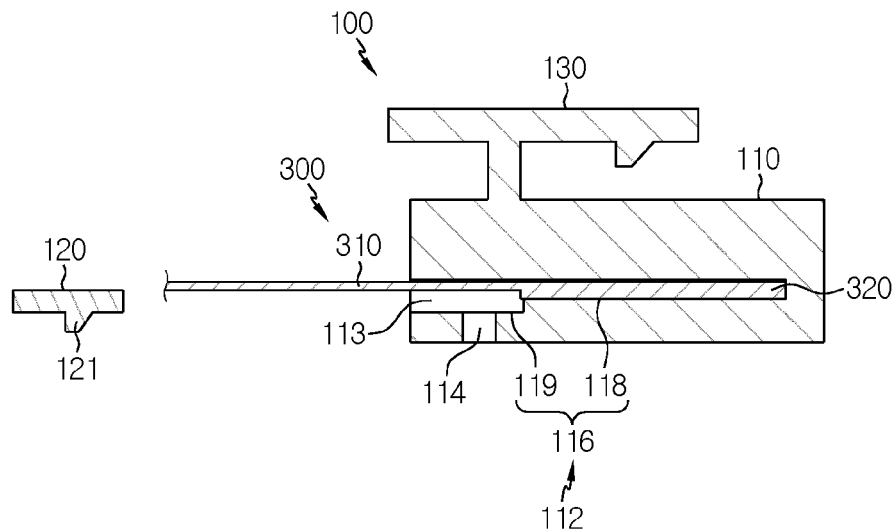
FIG. 7 is a sectional view of FIG. 6 showing that the first FPCB is inserted into an insert groove of a first body of the first main body.
Figure 8:
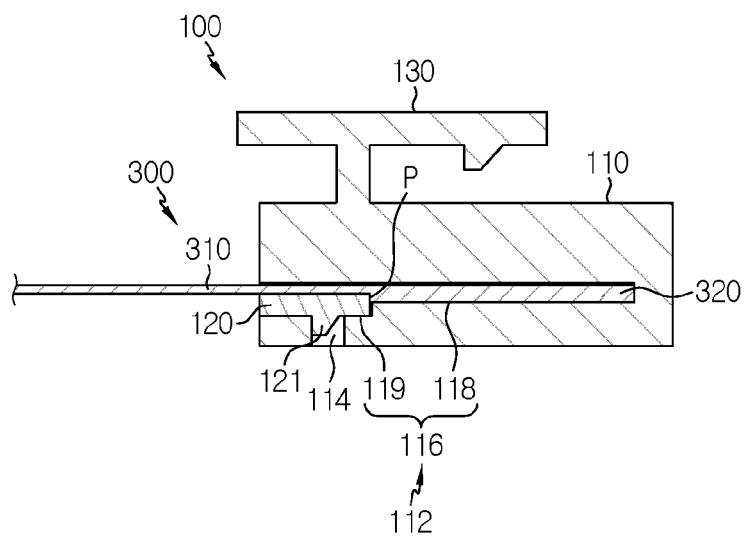
FIG. 8 is a sectional view of FIG. 7 showing that a first fixing portion is fixed to the first body of the first main body to fix the first FPCB.
Figure 9:
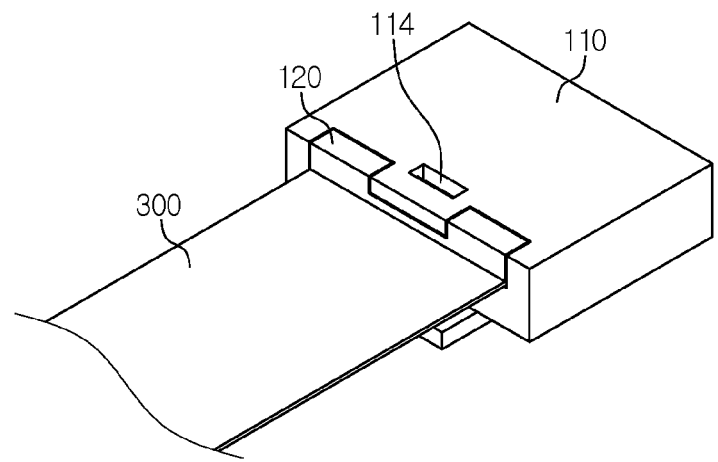
FIG. 9 is a perspective view showing the first main body of FIG. 3 in a vertically reversed state.
Figure 10:
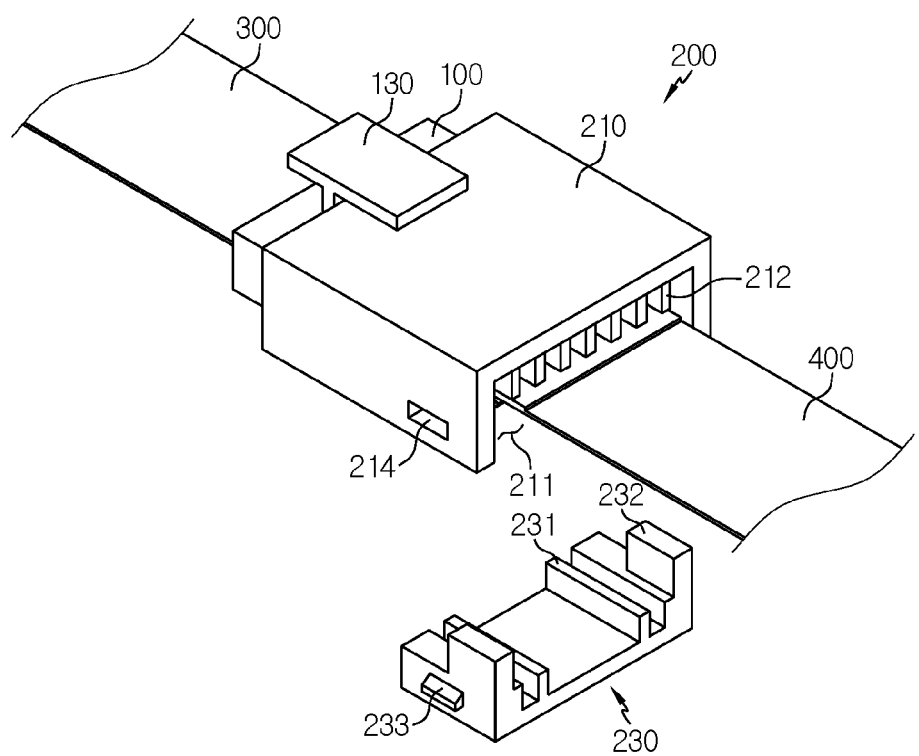
FIG. 10 is a perspective view showing that a second fixing portion is separated from a second body of the second main body of the FPCB connector according to the first embodiment of the present disclosure.
Figure 11:
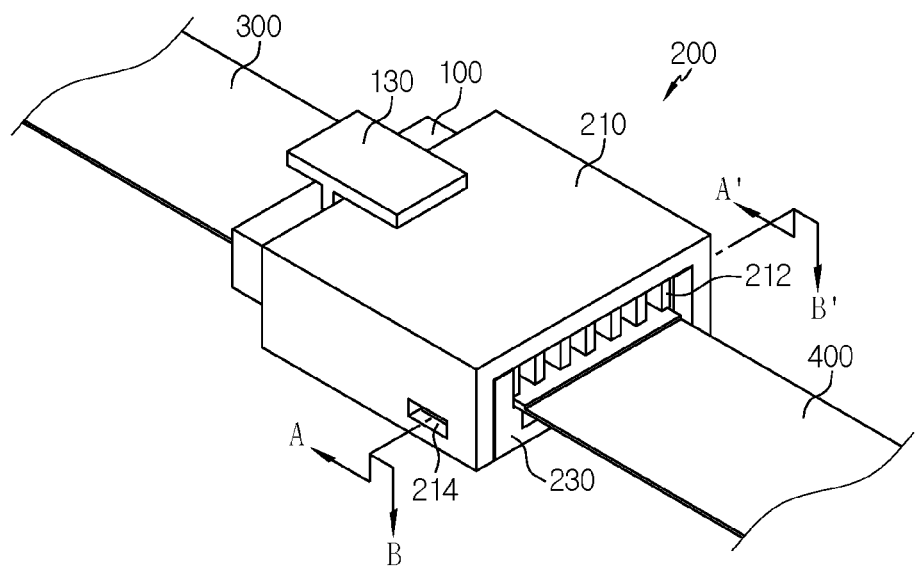
FIG. 11 is a perspective view of FIG. 10 showing that the second fixing portion is coupled to the second body of the second main body.
Figure 12:
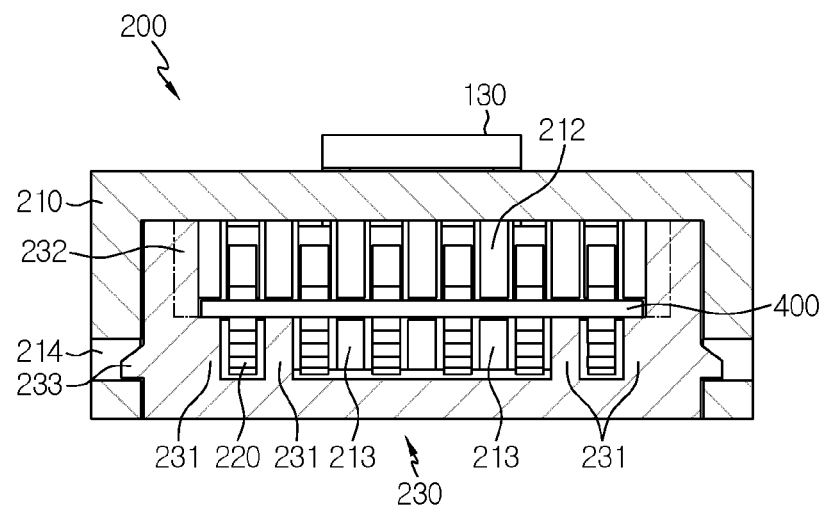
FIG. 12 is a sectional view, taken along an arrow A of FIG. 11.
Figure 13:
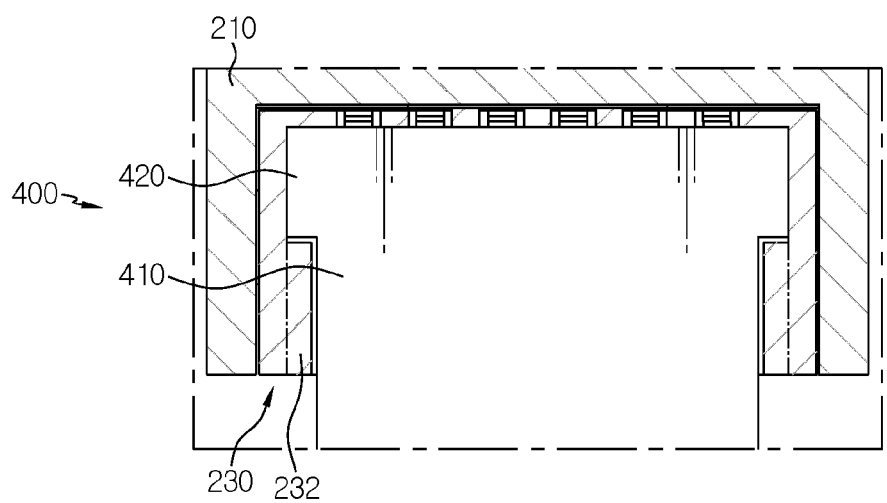
FIG. 13 is a sectional view, taken along an arrow B-B' of FIG. 11.

FIG. 2 is an exploded perspective view showing a FPCB connector according to the first embodiment of the present disclosure, FIG. 3 is a perspective view showing that a FPCB is coupled to a main body of a connector, in the FPCB connector according to the first embodiment of the present disclosure, FIG. 4 is a perspective view showing that a first main body of the connector coupled to a first FPCB and a second main body of the connector coupled to a second FPCB are coupled to each other, in the FPCB connector according to the first embodiment of the present disclosure, FIG. 5 is a sectional view of FIG. 4, FIG. 6 is an exploded sectional view showing the first main body of the FPCB connector according to the first embodiment of the present disclosure, FIG. 7 is a sectional view of FIG. 6 showing that the first FPCB is inserted into an insert groove of a first body of the first main body, FIG. 8 is a sectional view of FIG. 7 showing that a first fixing portion is fixed to the first body of the first main body to fix the first FPCB, FIG. 9 is a perspective view showing the first main body of FIG. 3 in a vertically reversed state, FIG. 10 is a perspective view showing that a second fixing portion is separated from a second body of the second main body of the FPCB connector according to the first embodiment of the present disclosure, FIG. 11 is a perspective view of FIG. 10 showing that the second fixing portion is coupled to the second body of the second main body, FIG. 12 is a sectional view, taken along an arrow A of FIG. 11, and FIG. 13 is a sectional view, taken along an arrow B-B' of FIG. 11.

Referring to FIG. 2, a FPCB connector 10 according to the first embodiment of the present disclosure includes a first main body 100 and a second main body 200. Also, a first FPCB 300 may be coupled to the first main body 100 without soldering, and a second FPCB 400 may be coupled to the second main body 200 without soldering.

Here, only the first FPCB may be connected to the first main body 100 without soldering, or only the second FPCB may be connected to the second main body 200 without soldering. Alternatively, both of the first FPCB 300 and the second FPCB 400 may be coupled to the first main body 100 and the second main body 200 without soldering, respectively.

Meanwhile, the first main body 100 and the second main body 200 may be any of a female connector and a male connector, but hereinafter, for convenience of explanation, it will be described that the first main body 100 is a female connector and the second main body 200 is a male connector. However, the scope of the present disclosure is not limited thereto.

The first FPCB 300 may be coupled to the first main body 100. As described above, the first FPCB 300 is coupled to the first main body 100 without soldering. To this end, the first main body 100 may include a first body 110 and a first fixing portion 120.

Referring to FIG. 2, an insert groove 111 is formed at the first body 110 so that the first FPCB 300 is inserted therein, and as shown in FIG. 3, the first FPCB 300 is inserted into the insert groove 111 of the first body 110. Referring to FIGS. 3, 4 and 9 together, the first fixing portion 120 is coupled to the first body 110 into which the first FPCB 300 is inserted to fix the first FPCB 300.

Referring to FIGS. 5 to 9, a hooking groove 114 may be formed at the first body 110, a hooking protrusion 121 may be formed at the first fixing portion 120, and the hooking protrusion 121 of the first fixing portion 120 may be fastened to the hooking groove 114 of the first body 110 so that the first fixing portion 120 is coupled to the first body 110. However, this coupling method is only an example.

Here, referring to FIG. 5, the first fixing portion 120 may be in contact with at least a portion of the first FPCB 300, and the first FPCB 300 is caught by a hooking point P of the first fixing portion 120 so as not to be separated from the first body 110. In this way, the first FPCB 300 may be coupled to the first main body 100 without soldering.

Specifically, referring to FIG. 6, a stepped portion 116 formed by a height difference may be formed at a bottom 112 of the first body 110. The stepped portion 116 includes a high surface 118 and a low surface 119. Also, the high surface 118 refers to a surface with a relatively great height compared to the low surface 119, and the low surface 119 refers to a surface with a relatively small height compared to the high surface 118.

Based on FIG. 6, a right side of the first body 110 is the high surface 118, and a left side is the low surface 119. The first FPCB 300 may include a first body portion 310 and a first end portion 320, and in this case, the first end portion 320 of the first FPCB 300 may be formed thicker than the first body portion 310 of the first FPCB 300.

Here, the first FPCB 300 may be located at one side of the stepped portion 116 to contact one side of the stepped portion 116 or to be spaced apart from one side of the stepped portion 116. For example, referring to FIG. 7 in which the first FPCB 300 is inserted into the insert groove 111 of the first body 110 of the first main body 100, the first end portion 320 of the first FPCB 300 formed thickly may contact the high surface 118 of the stepped portion 116, or alternatively, the first end portion 320 of the first FPCB 300 may be spaced apart from the high surface 118 of the stepped portion 116.

Since the first fixing portion 120, explained later, contacts the first body portion 310 of the first FPCB 300 to support the first body portion 310, the first end portion 320 of the first FPCB 300 may be spaced apart from the high surface 118 of the stepped portion 116.

In addition, referring to FIG. 7, if the first FPCB 300 is inserted into the insert groove 111 of the first body 110 of the first main body 100 (see FIG. 6), a preset space 113 is formed between the low surface 119 of the stepped portion 116 and the first body portion 310 of the first FPCB 300.

In addition, as shown in FIG. 8, if the first fixing portion 120 is inserted into the space 113 formed between the low surface 119 of the stepped portion 116 and the first body portion 310 of the first FPCB 300 and is coupled to the first body 110, the first fixing portion 120 contacts the first body portion 310 of the first FPCB 300 to support the first FPCB 300. At this time, the hooking protrusion 121 of the first fixing portion 120 may be fastened to the hooking groove 114 of the first body 110.

Here, the first fixing portion 120 does not need to press the first body portion 310 of the first FPCB 300. This is because, if the first fixing portion 120 presses the first body portion 310 of the first FPCB 300 too hard, the first FPCB 300 may be damaged. Accordingly, the first fixing portion 120 may be configured to simply contact the first body portion 310 of the first FPCB 300 so as to support the first FPCB 300.

As shown in FIG. 8, if the first fixing portion 120 comes into contact with the first body portion 310 of the first FPCB 300, the first end portion 320 of the first FPCB 300 formed thickly is caught at the hooking point P of the first fixing portion 120 is prevented from being separated from the first body 110. That is, even if the first FPCB 300 is pulled back, the first FPCB 300 does not fall out of the first main body 100. Accordingly, the first FPCB 300 may be coupled to the first main body 100 without soldering.

The second FPCB 400 is coupled to the second main body 200, and the second main body 200 is coupled to be electrically connected to the first main body 100.

The first main body 100 and the second main body 200 may be coupled in various ways. For example, referring to FIG. 2, a coupling groove 240 may be formed at an upper surface of the second main body 200, a coupling protrusion 130 may be formed at an upper side of the first main body 100 so as to be coupled to the coupling groove 240, and the coupling protrusion 130 of the first main body 100 may be fastened to the coupling groove 240 of the second main body 200 so that the first main body 100 and the second main body 200 are coupled to each other. However, the first main body 100 and the second main body 200 may be coupled in more diverse ways, and is not limited to the above coupling method.

In addition, as described above, the second FPCB 400 is coupled to the second main body 200 without soldering. To this end, the second main body 200 may include a second body 210, a terminal member 220 (see FIG. 5), and a second fixing portion 230.

Referring to FIG. 10, the second body 210 may have an open portion 211 formed to open one side thereof, and the second FPCB 400 is inserted into the second body 210 through the open portion 211.

The terminal member 220 is coupled to the second body 210. In addition, if the first main body 100 is coupled to the second main body 200, the terminal member 220 electrically connects the first FPCB 300 and the second FPCB 400. The terminal member 220 may be formed in various shapes.

For example, the terminal member 220 may be shaped as shown in FIG. 5 to contact both the first FPCB 300 and the second FPCB 400. However, the shape of the terminal member 220 is not limited to FIG. 5. In addition, the terminal member 220 may be made of various electrically conductive materials. For example, the terminal member 220 may be made of copper.

Referring to FIG. 11, the second fixing portion 230 is coupled to the second body 210 through the open portion 211 of the second body 210 into which the second FPCB 400 is inserted to fix the second FPCB 400.

Referring to FIG. 12, the second body 210 may have a first extension 212 and a second extension 213. The first extension 212 may be configured to extend from one side of the second body 210 of the second main body 200, for example from an upper side of the second body 210 based on FIG. 12. In addition, the second extension 213 may be configured to extend from the other side of the second body 210 of the second main body 200, for example from a lower side of the second body 210 based on FIG. 12, to be located opposite to the first extension 212.

In addition, as shown in FIG. 12, the second FPCB 400 is inserted and supported between the first extension 212 and the second extension 213. Here, the second extension 213 may be provided in plural, and the plurality of second extensions 213 may be arranged at preset intervals.

The first extension 212 may also be provided in plural, and the plurality of first extensions 212 may be arranged at the same interval as the second extensions 213. The first extension 212 and the second extension 213 may be disposed to face each other vertically. In addition, the terminal member 220 may be provided in plural, and the plurality of terminal members 220 may be disposed between the second extensions 213, respectively.

Here, referring to FIGS. 11 and 12, a contact portion 231 may be formed at the second fixing portion 230 to contact the second FPCB 400, and the contact portion 231 of the second fixing portion 230 is in contact with the second FPCB 400 to support the second FPCB 400. In addition, at least one of the plurality of terminal members 220 may be configured to be interposed between the contact portion 231 and the second extension 213.

Referring to FIGS. 2 and 13, the second FPCB 400 may include a second body portion 410 and a second end portion 420, and the second end portion 420 of the second FPCB 400 may be formed wider than the second body portion 410 of the second FPCB 400.

In addition, as shown in FIG. 13, the second fixing portion 230 may have catching portions 232 formed to extend inward from both end portions thereof, and the second end portion 420 of the second FPCB 400 having a greater width is caught by the catching portions 232 of the second fixing portion 230 and is thus prevented from being separated from the second body 210. That is, even if the second FPCB 400 is pulled downward based on FIG. 13, the second end portion 420 is caught by the catching portion 232 and thus the second FPCB 400 is not pulled out of the second body 210. Accordingly, the second FPCB 400 may be coupled to the second main body 200 without soldering.

Referring to FIGS. 10 and 11, after the second FPCB 400 is inserted into the second body 210 through the open portion 211, the second fixing portion 230 is coupled to the second body 210 from a lower side. Here, a hooking groove 214 may be formed at the second body 210, a hooking protrusion 233 may be formed at the second fixing portion 230, and the hooking protrusion 233 of the second fixing portion 230 may be fastened to the hooking groove 214 of the second body 210 so that the second fixing portion 230 is coupled to the second body 210. However, this coupling method is only an example.

Hereinafter, operations and effects of the FPCB connector 10 according to the first embodiment of the present disclosure will be described with reference to the drawings.

FIG. 6 shows a state before the first FPCB 300 is inserted into the insert groove 111 of the first body 110 of the first main body 100. Here, the stepped portion 116 is formed at the bottom 112 of the first body 110 due to a height difference. Referring to FIG. 7, if the first FPCB 300 is inserted into the insert groove 111 of the first body 110 of the first main body 100, the preset space 113 is formed between the low surface 119 of the stepped portion 116 and the first body portion 310 of the first FPCB 300. In addition, referring to FIG. 8, the first fixing portion 120 is inserted into the space 113 formed between the low surface 119 of the stepped portion 116 and the first body portion 310 of the first FPCB 300 and is coupled to the first body 110, whereby the first fixing portion 120 comes into contact with the first body portion 310 of the first FPCB 300 to support the first FPCB 300. If the first fixing portion 120 comes into contact with the first FPCB 300 in this way, the first end portion 320 of the first FPCB 300 having a greater thickness is caught by the hooking point P of the first fixing portion 120 and is thus prevented from being separated from the first body 110. Accordingly, the first FPCB 300 may be coupled to the first main body 100 without soldering.

In addition, referring to FIG. 10, the second FPCB 400 is inserted into the second body 210 through the open portion 211 formed at the second body 210, and referring to FIG. 11, the second fixing portion 230 is coupled to the second body 210 through the open portion 211 of the second body 210 into which the second FPCB 400 is inserted to fix the second FPCB 400. In addition, as shown in FIG. 13, the second end portion 420 of the second FPCB 400 having a greater width is caught by the catching portion 232 of the second fixing portion 230 and is thus prevented from being separated from the second body 210. Accordingly, the second FPCB 400 may be coupled to the second main body 200 without soldering.

In addition, as shown in FIGS. 3 and 4, if the first main body 100 and the second main body 200 are coupled, as in FIG. 5, the terminal member 220 comes into contact with both the first FPCB 300 and the second FPCB 400, so that the first FPCB 300 and the second FPCB 400 are electrically connected.

Figure 14:
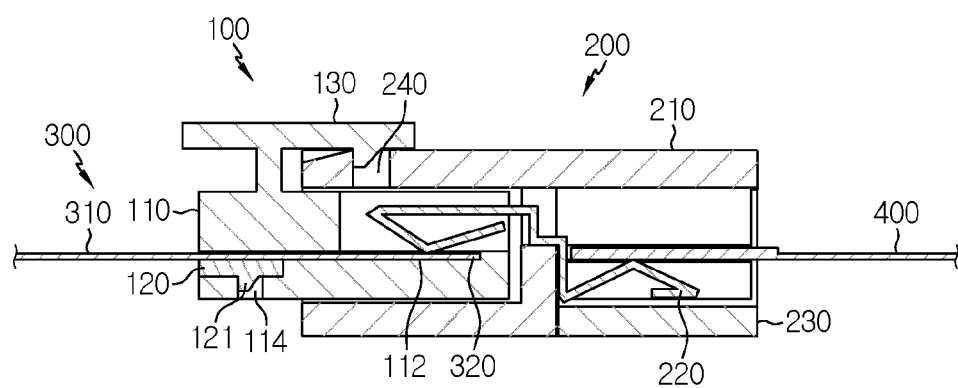
FIG. 14 is a sectional view showing that the first main body of the connector coupled to the first FPCB and the second main body of the connector coupled to the second FPCB are coupled to each other, in a FPCB connector according to the second embodiment of the present disclosure.

FIG. 14 is a sectional view showing that the first main body of the connector coupled to the first FPCB and the second main body of the connector coupled to the second FPCB are coupled to each other, in a FPCB connector according to the second embodiment of the present disclosure.

Hereinafter, the operations and effects of the FPCB connector 10 according to the second embodiment of the present disclosure will be described with reference to the accompanying drawings. Here, a feature already explained in relation to the FPCB connector 10 according to the first disclosure of the present disclosure will not be described in detail again.

Referring to FIG. 14, in the second embodiment of the present disclosure, the stepped portion 116 is not formed at the bottom 112 of the first body 110 of the first main body 100, and the first body portion 310 and the first end portion 320 are formed with the same thickness, different from the first embodiment.

Meanwhile, a battery module (not shown) according to an embodiment of the present disclosure may include at least one FPCB connector 10 as described above. The battery module (not shown) includes a battery cell stack, and the FPCB connector 10 according to an embodiment of the present disclosure may be used for electrical connection to sense temperature or the like of a battery cell. However, the use of the FPCB connector 10 is not limited to sensing.

Meanwhile, a battery pack 1 according to an embodiment of the present disclosure, may include one or more battery modules 2 as described above. Also, in addition to the battery modules 2, the battery pack 1 may further includes a case for accommodating the battery modules 2, and various devices for controlling charge and discharge of the battery modules 2, such as a battery management system (BMS), a current sensor, a fuse, and the like. In addition, the FPCB connector 10 according to an embodiment of the present disclosure may be used to connect LV wires (Low Voltage Wires) used in a battery pack 1 to each other. However, the use of the FPCB connector 10 is not limited to LV wires.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

INDUSTRIAL APPLICABILITY

The present disclosure relates to a FPCB connector, and a battery module and a battery pack including the FPCB connector, and may be used in industries related to batteries.

What is claimed is:

1. A flexible printed circuit board (FPCB) connector, comprising:
  a first main body configured to be coupled to first FPCB; and
  a second main body configured to be coupled to second FPCB that is coupled and electrically connected to the first main body,
  wherein at least one of the first main body and the second main body is configured to be coupled to the first FPCB or the second FPCB without soldering.
2. The FPCB connector according to claim 1,
  wherein the first main body includes:
  a first body having an insert groove configured to receive the first FPCB; and
  a first fixing portion coupled to the first body and configured to fix the first FPCB in place.
3. The FPCB connector according to claim 2,
  wherein a stepped portion formed by a height difference is formed at a bottom of the first body, and
  the stepped portion is adapted for the first FPCB to be located along a first surface of the stepped portion when inserted into the insert groove and either in contact with the first surface of the stepped portion or spaced apart from the first surface of the stepped portion.
4. The FPCB connector according to claim 3,
  wherein the stepped portion includes:
  a high surface having a first height; and
  a low surface having a second height that is lower than the first height,
  wherein the first FPCB has a first body portion and a first end portion, wherein the first end portion of the first FPCB is thicker than the first body portion of the first FPCB,
  the high surface of the stepped portion is configured to be in contact with or to be spaced apart from the first end portion of the first FPCB,
  the low surface of the stepped portion is configured to be spaced apart from the first body portion of the first FPCB by a predetermined space, and
  the first fixing portion is configured to be inserted into the space to be coupled to the first body and in contact with the first body portion of the first FPCB.
5. The FPCB connector according to claim 1,
  wherein the second main body includes a coupling groove formed at an upper surface of the second main body, and
  wherein the first main body includes a coupling protrusion coupled to the coupling groove and formed at an upper side of the first main body so that the first main body and the second main body are coupled to each other.
6. The FPCB connector according to claim 1,
  wherein the second main body includes:
  a second body having an open portion formed at one side thereof and configured to receive the second FPCB;
  one or more terminal members coupled to the second body and configured to electrically connect the first FPCB and the second FPCB when the first main body is coupled to the second main body; and
  a second fixing portion coupled to the second body through the open portion of the second body and configured to receive the second FPCB to fix the second FPCB in place.
7. The FPCB connector according to claim 6,
  wherein the second body includes:
  one or more first extensions extending from a first side of the second main body; and
  one or more second extensions extending from a second side of the second main body and located opposite to the first extension,
  wherein the second body is configured to receive the second FPCB between the first extension and the second extension.
8. The FPCB connector according to claim 7,
  wherein the one or more second extensions is a plurality of second extensions arranged at preset intervals, and
  the one or more terminal members is a plurality of terminal members, wherein each terminal member is disposed between a respective pair of second extensions.
9. The FPCB connector according to claim 8,
  wherein the second fixing portion includes a contact portion configured to contact the second FPCB, and
  at least one of the plurality of terminal members is interposed between the contact portion and one of the plurality of second extensions.
10. The FPCB connector according to claim 6,
  wherein the second FPCB has a second body portion and a second end portion wherein the second end portion of the second FPCB is wider than the second body portion of the second FPCB, and
  the second fixing portion includes catching portions extending inward into the second body and configured to catch the second end portion of the second FPCB.
11. A battery module, comprising the FPCB connector according to claim 1.
12. A battery pack, comprising the FPCB connector according to claim 1.

* * * * *